United States Patent
Enzmann et al.

(10) Patent No.: US 9,450,376 B2
(45) Date of Patent: Sep. 20, 2016

(54) METHOD OF PRODUCING A SEMICONDUCTOR LASER ELEMENT, AND SEMICONDUCTOR LASER ELEMENT

(71) Applicant: OSRAM Opto Semiconductors GmbH, Regensburg (DE)

(72) Inventors: Roland Enzmann, Regensburg (DE);
Stephan Haneder, Regensburg (DE);
Markus Arzberger, Regensburg (DE);
Christoph Walter, Regensburg (DE);
Tomasz Swietlik, Regensburg (DE);
Harald König, Bernhardswald (DE);
Robin Fehse, Bad Abbach (DE);
Mathias Kämpf, Burglengenfeld (DE);
Markus Graul, Regensburg (DE);
Markus Horn, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/420,411

(22) PCT Filed: Aug. 12, 2013

(86) PCT No.: PCT/EP2013/066827
§ 371 (c)(1),
(2) Date: Feb. 9, 2015

(87) PCT Pub. No.: WO2014/026951
PCT Pub. Date: Feb. 20, 2014

(65) Prior Publication Data
US 2015/0207293 A1    Jul. 23, 2015

(30) Foreign Application Priority Data
Aug. 13, 2012 (DE) .................. 10 2012 107 409

(51) Int. Cl.
*H01S 5/00* (2006.01)
*H01S 5/02* (2006.01)
*H01S 5/022* (2006.01)

(52) U.S. Cl.
CPC .......... *H01S 5/0201* (2013.01); *H01S 5/0202* (2013.01); *H01S 5/02272* (2013.01); *H01S 5/02268* (2013.01); *H01S 5/02276* (2013.01)

(58) Field of Classification Search
CPC ............... H01S 5/0201; H01S 5/0202; H01S 5/02272; H01S 5/02268; H01S 5/02276
See application file for complete search history.

(56) References Cited

U.S. PATENT DOCUMENTS 6,015,998 A    1/2000   Bergmann et al.
6,195,376 B1 *   2/2001   Wilson ................ H01S 5/02272
                                                                                  372/36

(Continued)

FOREIGN PATENT DOCUMENTS

DE    203 21 880 U1    11/2011
EP    1 696 528 A1    8/2006

(Continued)

OTHER PUBLICATIONS

English translation of the Notification of Reasons for Refusal dated Mar. 22, 2016, of corresponding Japanese Application No. 2015-526957.

*Primary Examiner* — Yuanda Zhang
(74) *Attorney, Agent, or Firm* — DLA Piper LLP (US)

(57) ABSTRACT

A method of producing a semiconductor laser element includes A) providing at least one carrier assemblage having a multiplicity of carriers for the semiconductor laser elements, C) providing at least one laser bar having a multiplicity of semiconductor laser diodes which include a common growth substrate and a semiconductor layer sequence grown thereon, D) fitting the laser bar on a top side of the carrier assemblage, and E) singulating to form the semiconductor laser elements after D).

17 Claims, 6 Drawing Sheets

(56) References Cited

U.S. PATENT DOCUMENTS

| | | | |
|---|---|---|---|
| 6,281,032 B1 | 8/2001 | Matsuda et al. | |
| 6,488,021 B1 | 12/2002 | Yamane et al. | |
| 2002/0172244 A1 | 11/2002 | Li et al. | |
| 2004/0137655 A1 | 7/2004 | Chikuma et al. | |
| 2005/0110025 A1* | 5/2005 | Furst | H01L 31/02005 257/80 |
| 2010/0189146 A1 | 7/2010 | Bessho et al. | |
| 2010/0200864 A1 | 8/2010 | Bader et al. | |
| 2012/0187449 A1* | 7/2012 | Negishi | H01S 5/0202 257/184 |
| 2012/0326178 A1* | 12/2012 | Fehrer | H01L 24/24 257/88 |

FOREIGN PATENT DOCUMENTS

| | | | |
|---|---|---|---|
| EP | 2 091 116 A2 | 8/2009 | |
| JP | 58-138086 A | 8/1983 | |
| JP | 63-204687 | 8/1988 | |
| JP | 64-28882 | 1/1989 | |
| JP | 03286547 A * | 12/1991 | H01L 21/66 |
| JP | 06-334262 | 12/1994 | |
| JP | 2002232061 A * | 8/2002 | H01S 5/022 |
| JP | 2004-031669 A | 1/2004 | |
| JP | 2010-045076 | 2/2010 | |
| JP | 2011-222632 | 11/2011 | |
| WO | WO 2011073027 A1 * | 6/2011 | H01L 24/24 |

* cited by examiner

METHOD OF PRODUCING A SEMICONDUCTOR LASER ELEMENT, AND SEMICONDUCTOR LASER ELEMENT

TECHNICAL FIELD

This disclosure relates to a method of producing a semiconductor laser element and a semiconductor laser element.

BACKGROUND

There is a need to efficiently produce a semiconductor laser element with small positioning tolerances.

SUMMARY

We provide a method of producing a semiconductor laser element including A) providing at least one carrier assemblage having a multiplicity of carriers for the semiconductor laser elements, C) providing at least one laser bar having a multiplicity of semiconductor laser diodes which include a common growth substrate and a semiconductor layer sequence grown thereon, D) fitting the laser bar on a top side of the carrier assemblage, and E) singulating to form the semiconductor laser elements after D).

We also provide a semiconductor laser element including a carrier having an end side and a top side oriented perpendicularly thereto, and a semiconductor laser diode having a growth substrate and a semiconductor layer sequence at the top side that generates laser radiation, wherein the carrier and the semiconductor laser diode have identical widths and side surfaces of the carrier and of the semiconductor laser diode terminate flush with one another, in each case with a tolerance of at most 6 µm, and the side surfaces are oriented parallel to one another and have singulation traces.

We further provide a method of producing a semiconductor laser element including A) providing at least one carrier assemblage having a multiplicity of carriers for the semiconductor laser elements, B) producing predetermined breaking locations in the carrier assemblage between adjacent carriers, C) providing at least one laser bar having a multiplicity of semiconductor laser diodes which include a common growth substrate and a semiconductor layer sequence grown thereon, D) fitting the laser bar on a top side of the carrier assemblage, and E) singulating to form the semiconductor laser elements after D).

DETAILED DESCRIPTION

Our method may comprise providing at least one carrier assemblage. A multiplicity of carriers are combined in the carrier assemblage, wherein the carriers are provided for the finished semiconductor laser elements. By way of example, the carrier assemblage is a strip of a thermally conductive material to be subdivided into the individual carriers.

The method may comprise producing at least one predetermined breaking location in the carrier assemblage. The predetermined breaking location is preferably localized between adjacent carriers. By virtue of the predetermined breaking locations, the carrier assemblage can be efficiently singulated to form the carriers.

At least one laser bar may be provided in the method. The laser bar comprises a multiplicity of semiconductor laser diodes. In particular, the laser bar is formed from a growth substrate and a semiconductor layer sequence grown thereon. The semiconductor layer sequence comprises one or a plurality of active layers that generate electromagnetic radiation during operation of the semiconductor laser diode. The growth substrate and the semiconductor layer sequence preferably extend over the entire laser bar. It is possible for the laser bar, alongside the growth substrate, to at least temporarily comprise a further, mechanically supporting component such as an auxiliary carrier.

The method may comprise fitting the laser bar on a top side of the carrier assemblage. Fitting preferably involves soldering. Equally fitting can also be carried out by adhesive bonding, in particular with an electrically conductive connector.

The method may comprise singulating to form the semiconductor laser elements. Singulating is carried out after fitting the laser bars onto the carrier assemblage. Singulating is carried out, for example, by laser radiation and/or by breaking.

The method may comprise at least the following steps:
A) providing at least one carrier assemblage having a multiplicity of carriers for the semiconductor laser elements,
B) producing predetermined breaking locations in the carrier assemblage between adjacent carriers,
C) providing at least one laser bar having a multiplicity of semiconductor laser diodes which comprise a common growth substrate and a semiconductor layer sequence grown thereon,
D) fitting the laser bar on a top side of the carrier assemblage, and
E) singulating to form the semiconductor laser elements.

The individual method steps can be carried out in the stated order. Method step B) is optional here and preferably succeeds method step A). The combination of method steps A) and optionally B) can be implemented before or after step C). Method step E) succeeds method step D).

During the mounting of laser diodes, in particular monomode laser diodes, generally only small production tolerances are allowed and precise alignment of the lasers is required. This is the case, in particular, if laser radiation from the semiconductor laser diode is intended to be coupled into an optical waveguide. For radiation in the near infrared spectral range, for instance, a mode field diameter of an optical waveguide in the monomode regime is approximately 4 µm to 4.5 µm. Therefore, production tolerances of ≤3 µm or ≤2 µm are generally required to obtain a good optical coupling between an optical waveguide and a semiconductor laser element.

In the context of the production method, here the individual semiconductor laser diodes grown, for example, epitaxially on a larger wafer are to be singulated and fitted on a carrier. For later simplification of the alignment of the semiconductor laser element, it is necessary for the semiconductor laser diode to be mounted on the carrier precisely relative to the carrier.

Such precise mounting of the semiconductor laser diode on the carrier is carried out in particular by a component placement machine, referred to as die bonder. Given the required high precision of 2 µm to 3 µm, given a breadth of distribution of the positioning accuracy of 3 σ, a throughput of such placement machines is of the order of magnitude of 500 to 1000 items/hour. Placement using such placement machines given the required precision is therefore a significant cost factor on production on account of the relatively low throughput.

In accordance with the production method specified above, the process of singulating the laser bar to form the semiconductor laser diodes is carried out only after the process of fitting to the carrier assemblage. As a result, the laser bar and carrier assemblage as a whole can be precisely aligned with respect to one another. Consequently, a multiplicity of semiconductor laser diodes can be simultaneously positioned relative to the carrier assemblage and the associated carriers for instance by a placement machine. Therefore, it is possible to increase the throughput of semiconductor laser elements, relative to the capacity of a placement machine, by a factor approximately corresponding to the number of semiconductor laser diodes in the laser bar. This can be associated with a significant lowering of costs in production.

The top side may be oriented perpendicularly to an end side of the carrier assemblage. Perpendicularly can mean that the end side and the top side are situated at right angles to one another, in particular with a tolerance of at most 3° or of at most 1.5° or of at most 0.5°.

The semiconductor laser diodes may terminate flush with the end side in and/or after steps D) and E). It is likewise possible for the end side to project beyond the semiconductor laser diodes. A projection of the end side beyond the semiconductor laser diodes is, for example, at least 0.5 µm or at least 1.5 µm. Alternatively or additionally, the projection is at most 5 µm or at most 4 µm. A production tolerance here is preferably at most 3 µm given a breadth of distribution of 3 σ. Flush can mean that the end side and the semiconductor laser diodes mutually project beyond one another by at most 3 µm or by at most 1.5 µm or by at most 0.5 µm.

The semiconductor laser diodes may be edge emitting lasers. An emission direction of the semiconductor laser diodes is then preferably oriented perpendicularly to the end side. Edge emitting can mean that the emission direction is oriented perpendicularly to a growth direction of the semiconductor layer sequence and thus runs in particular parallel to the top side.

Further predetermined breaking locations may be produced at or in the laser bar before, after or in step D). The laser bar can be singulated along the predetermined breaking locations in step E). The laser bars are preferably provided with the further predetermined breaking locations before the laser bars are fitted to the carrier assemblage, that is to say before step D).

In step D), the laser bars are separated to form the semiconductor laser diodes by scribing, breaking, sawing, and/or action of laser radiation. The carrier assemblage is simultaneously singulated with this step or after this step. This singulating of the carrier assemblage can likewise be scribing, breaking, sawing and/or singulating by laser radiation.

The adjacent carriers in the carrier assemblage need not be mechanically connected directly to one another after the carrier assemblage has been singulated. This can mean that there is no mechanically loadable, self-supporting connection between a carrier and the directly adjacent carrier. However, it is possible for adjacent carriers to be coupled mechanically and stably relative to one another by further constituent parts of the carrier assemblage or by an auxiliary carrier. It is likewise possible for adjacent carriers to touch one another without sufficient mechanical coupling being provided. As an alternative thereto, adjacent carriers no longer touch one another after singulation.

One or a plurality of the semiconductor laser diodes may be situated at each of the carriers after step E). In particular, there is a one-to-one assignment between the carrier and the semiconductor laser diodes.

The predetermined breaking location may extend in the carrier assemblage at least 25% or at least 40% through the carrier assemblage, in a direction perpendicular to the top side. Alternatively or additionally, the predetermined breaking location extends at most 75% or at most 60% through the carrier assemblage. By way of example, the predetermined breaking location is produced by laser radiation. The mechanical integrity between adjacent carriers is not totally destroyed in the event of the predetermined breaking location being created in such a way.

The laser bar in step D) may comprise at least ten or at least 15 or at least 25 of the semiconductor laser diodes. Alternatively or additionally, the laser bar in step D) comprises at most 60 or at most 50 of the semiconductor laser diodes.

The semiconductor laser diodes may be monomode lasers. During use as intended, the semiconductor laser diodes and the finished produced semiconductor laser elements then emit laser radiation of exactly one mode, in particular the fundamental mode. As an alternative thereto, the semiconductor laser diodes can also be multimode lasers.

In step D) a plurality of the laser bars and a plurality of the carrier assemblages may be combined alternately successively to form a rack (i.e., group). In the rack, all the carrier assemblages and laser bars can be identically aligned within the scope of the production tolerances. Assembling laser bars and carriers in a rack is also carried out, for example, when creating mirror layers at lateral boundary surfaces of the semiconductor laser diodes and/or of the laser bar. Given correspondingly accurate manufacture and accurate geometrical dimensions of the laser bars and carrier assemblages, a precise alignment of a multiplicity of laser bars and carrier assemblages relative to one another in the rack is possible.

In each case one of the laser bars in the rack may be fixed to exactly one of the carrier assemblages. Fixing is soldering, for example. After the laser bars have been fixed to in each case one of the carrier assemblages, step E) is then preferably carried out.

After step E), side surfaces of the divided growth substrate, side surfaces of the semiconductor layer sequence and/or side surfaces of the singulated carriers may be aligned parallel to one another. Furthermore, the carrier, the divided growth substrate and the semiconductor layer sequence within one of the semiconductor laser diodes or semiconductor laser elements preferably have identical widths in a direction parallel to the end side and in a direction parallel to the top side. Furthermore, the side surfaces of the divided growth substrate and of the carriers preferably terminate flush with one another. The side surfaces of the carrier and of the divided growth substrate can lie in a common plane. The abovementioned geometrical properties are preferably realized with a tolerance of at most 6 µm or at most 4 µm or at most 2 µm.

The side surfaces here are in particular those boundary surfaces which, within the scope of the production tolerances, are aligned both perpendicularly to the end side and perpendicularly to the top side.

The carrier assemblage may project beyond the laser bar at a rear side situated opposite the end side. The carrier assemblage then projects beyond the laser bar at the rear side.

That partial region of the carrier assemblage which projects beyond the laser bar may form a holding strip at the rear side. The adjacent carriers are still mechanically coupled by the holding strip, even after the predetermined breaking locations have been created in the carrier assemblage or after adjacent carriers have been directly separated from one another mechanically. Handling is facilitated as a result. Such a holding strip is present in particular in step D) and/or step E).

The holding strip may be partly or completely removed in or after step E). The holding strip is then no longer present or only partly present in the finished semiconductor laser elements.

The finished semiconductor laser elements may have a width of at least 100 µm or at least 150 µm and/or of at most 350 µm or at most 250 µm. A length of the finished semiconductor laser elements, in a direction perpendicular to the end side and in a direction parallel to the top side, is alternatively or additionally at least 175 µm or at least 250 µm and/or at most 700 µm or at most 500 µm.

The finished semiconductor laser elements may have a thickness in a direction perpendicular to the top side, of at least 125 µm or of at least 200 µm. Alternatively or additionally, the thickness is at most 600 µm or at most 450 µm or at most 350 µm.

The carrier assemblage and thus the carriers may be produced from silicon or from aluminum nitride or consist thereof. In particular, the carrier assemblage has no or only a low electrical conductivity. If the carrier assemblage is produced from silicon, then a dopant concentration is at most $1 \times 10^{18}/cm^3$, for example. The carrier can be free of an inner structure such as via holes or pn junctions. As an alternative thereto, the carrier can also be formed from an electrically conductive material, for instance from doped silicon or germanium or from a metal such as Mo or an Mo alloy. If the carrier is electrically conductive, then the semiconductor laser diode can be electrically contacted via the carrier. Furthermore, the carrier can have via holes.

One or a plurality of electrically conductive coatings may be formed in places or over the whole area at least at the top side. The coatings can be realized by one or a plurality of metal layers. The electrically conductive coating can be structured to form conductor tracks and/or contact areas.

The semiconductor layer sequence and/or the semiconductor laser diode may be based on $Al_nIn_{1-n-m}Ga_mAs$ where $0 \leq n \leq 1$, $0 \leq m \leq 1$ and $n+m \leq 1$. In this case, the semiconductor layer sequence can also comprise dopants. The semiconductor laser diode is then preferably designed to emit laser radiation in the wavelength range of 790 nm to 890 nm or 805 nm to 855 nm.

It is likewise possible for the semiconductor laser diode to be based on the material system AlInGaN or InP. An emission wavelength is then in particular in the ultraviolet or blue spectral range or in the near infrared, for example, 1.3 µm to 1.5 µm.

The steps mentioned below may be carried out preferably in the stated order, wherein the steps presented can directly succeed one another:
  providing the carrier assemblage, based in particular on silicon, wherein the carrier assemblage is preferably free of predetermined breaking locations,
  providing the laser bar, wherein the laser bar has predetermined breaking locations between adjacent semiconductor laser diodes and the predetermined breaking locations are formed in particular in each case by a scribed location and can be situated at an n-side of the semiconductor layer sequence,
  fitting the laser bar to the top side of the carrier assemblage, wherein preferably the n-side faces the top side, and
  singulating the carrier assemblage to form the carriers with subsequent or simultaneous breaking of the laser bar.

Furthermore, we provide a semiconductor laser element. The semiconductor laser element is preferably produced by a method as described in association with one or more of the examples mentioned above. Therefore, features of the method are also disclosed for the semiconductor laser element, and vice versa.

The semiconductor laser element may comprise a carrier having an end side and a top side oriented preferably perpendicularly thereto. Furthermore, the semiconductor laser element comprises a semiconductor laser diode comprising a growth substrate and a semiconductor layer sequence to generate laser radiation. The semiconductor laser diode is fitted to the top side. The carrier and the semiconductor laser diode have identical widths and side surfaces of the carrier and of the semiconductor laser diode terminate flush with one another and are preferably aligned parallel to one another, in particular with a tolerance of at most 6 µm or with a tolerance of at most 4 µm or with a tolerance of at most 2 µm or exactly. Furthermore, the side surfaces have singulation traces.

The fact that the side surfaces have singulation traces can mean that the side surfaces are not subsequently ground or polished after singulation to form the semiconductor laser elements. The singulation traces can be in the form of a roughening of the side surfaces. In particular, traces of scribing for instance of the growth substrate or of the semiconductor layer sequence, or laser processing may be discernible at the side surfaces.

A method described here and a semiconductor laser element described here are explained in greater detail below on the basis of examples with reference to the drawings. In this case, identical reference signs indicate identical elements in the individual figures. However, relations to scale are not illustrated in this case. Rather, individual elements may be illustrated with an exaggerated size to afford a better understanding.

FIGS. 1A to 1G schematically illustrate a method of producing a semiconductor laser element 1. In accordance with the perspective illustration in FIG. 1A, a carrier assemblage 20 is provided. The carrier assemblage 20 comprises a multiplicity of carriers 2 mechanically integrated among one another in the carrier assemblage 20. The carrier assemblage 20 has an end side 27 and a top side 23 oriented perpendicularly thereto.

The top side 23 is provided with a metallization 24. The metallization 24 is formed, for example, from a titanium layer, a platinum layer and a gold layer, which succeed one another in a direction away from the carrier assemblage 20. In T-shaped regions, the top side 23 of the carrier assemblage 20 is exposed in places; no metallization is applied in these regions. Contact locations 5 are shaped in places on the metallization 24. Exactly one of the contact locations 5 is provided for each of the carriers 2. The contact locations 5 are preferably formed by an AuSn metallization.

The carrier assemblage 20 is produced from a silicon wafer, for example. A thickness of the carrier assemblage 20, in a direction perpendicular to the top side 23, is approximately 200 µm, for example. A width of the carrier assemblage 20 is in particular 10 mm to 30 mm, for example, approximately 20.8 mm. A length of the carrier assemblage 20 is, for example, 0.7 mm to 2.0 mm, in particular approximately 1.2 mm.

FIG. 1B illustrates that predetermined breaking locations 25 are produced in the carrier assemblage 20 by laser radiation R. The predetermined breaking locations 25 are oriented perpendicularly to the top side 23 and to the end side 27. Preferably, the predetermined breaking locations 25 do not completely penetrate through the carrier assemblage 20, in a direction perpendicular to the top side 23, by contrast to the illustration shown. The predetermined breaking locations 25 are not produced in a holding strip 8 at a rear side 28 of the carrier assemblage 20. In this case, the rear side 28 is situated opposite the end side 27. The individual carriers 2 between which the predetermined breaking locations 25 are connected mechanically connect to one another by the holding strip 8. The method step shown in FIG. 1B is optional.

Creating the predetermined breaking locations 25 preferably involves so-called "stealth dicing." In this case, by the nonlinear absorption of a focused, pulsed laser beam having a wavelength for which the carrier assemblage 20 is transparent at moderate intensities, within the carrier assemblage 20, a defect is produced in the material. As an alternative thereto, the predetermined breaking locations can also be created by scribing or sawing.

FIG. 1C illustrates that a laser bar 30 is provided. The laser bar 30 has a continuous growth substrate 31, onto which a preferably likewise continuous semiconductor layer sequence 32 is applied in particular epitaxially. The laser bar 30 comprises a multiplicity of semiconductor laser diodes 3. The semiconductor laser diodes 3 are preferably edge emitting lasers having a ridge waveguide.

The growth substrate 31 is, for example, a GaAs substrate having a thickness of approximately 100 µm. The semiconductor layer sequence 32 is based on AlInGaAs, in particular, and has a thickness of approximately 10 µm, for example.

The laser bar 30 and thus the semiconductor laser diodes 3 have a front side 37. A contact location 4 is situated at top sides of the semiconductor laser diodes 3 facing away from the carrier assemblage 20. By the contact location 4, the semiconductor laser diodes can be contacted, for example, by a bonding wire, not depicted. The contact location 4 can be formed by a metallization, in particular with a gold layer.

Optically active layers such as highly reflective mirror layers or antireflection layers can be applied at the front side 37 and optionally at a rear side of the semiconductor laser diodes 3 situated opposite the front side 37. Optionally, in the method step in accordance with FIG. 1C, at a side situated opposite the contact locations 4 or at the top side with the contact locations 4, further predetermined breaking locations 35 are produced between adjacent semiconductor laser diodes 3 in the laser bar 30. The further predetermined breaking locations 35 can be produced by scribing or else by laser radiation.

In accordance with FIG. 1D, the laser bar 30 is applied to the carrier assemblage 20. This is carried out by a placement machine, for example. The laser bar 30 is preferably soldered onto the carrier assemblage 20. A relative positioning accuracy between the carrier assemblage 20 and the laser bar 30 is preferably in the range of a few micrometers. The front side 37 of the laser bar 30 in this case terminates, for example, flush with the end side 27, for example, with a tolerance of at most 2 µm.

In the method step as shown in FIG. 1E, adjacent semiconductor laser diodes 3 are mechanically separated from one another by the production of singulation regions 9. The laser bar 30 is singulated to form the semiconductor laser diodes 3 preferably by breaking along the predetermined breaking locations 35 produced in particular by scribing, also see FIG. 1C, or else by material decomposition in places by focused laser radiation, alone or in combination with, for instance, breaking. Breaking can be carried out by a wedge apparatus. As an alternative to such breaking, the laser bar 30 can also be singulated by expansion of a film to which the laser bar 30 is fitted.

In contrast to the illustration shown, it is possible for the carriers 2 also to be separated from one another along the predetermined breaking locations 25 in further singulation regions 9 at the same time as the singulation of the laser bar 30. However, this step can also succeed the singulation of the laser bar 30. Optionally, there is a mechanical connection between adjacent carriers 2 by the holding strip 8.

The singulation regions 9 in the laser bar 30 and in the carrier assemblage 20 are preferably situated congruently one above another, in a direction perpendicular to the top side 23. A lateral offset between the singulation regions 9 is, for example, at most 6 µm or at most 4 µm or at most 2 µm.

In the optional method step shown in plan view in accordance with FIG. 1F, in particular by material decomposition by focused laser radiation and/or breaking, the resulting semiconductor laser elements as shown in FIG. 1G are separated from the holding strip 8. The resulting semiconductor laser elements 1 can be seen in FIG. 1G.

The carrier 2 projects beyond the semiconductor laser diode 3 in a direction away from the end side 27. The semiconductor laser diode 3 and the carrier 2 have approximately identical widths. Side surfaces 29, 39 of the carrier 2 and of the semiconductor laser diode 3 have singulation traces, not depicted.

A further contact location 5 is preferably situated at an underside of the carrier 2 facing away from the semiconductor laser diode 3, the further contact location being formed, for example, by one or a plurality of metallizations at the underside. The carrier 2 is then preferably electrically conductive or has at least one via hole (not depicted). Alternatively, in contrast to the depiction shown, the contact location 5 can be situated in that region of the carrier top side 23 which projects beyond the semiconductor laser diode 3 in a direction away from the front side 37.

Figure 2:
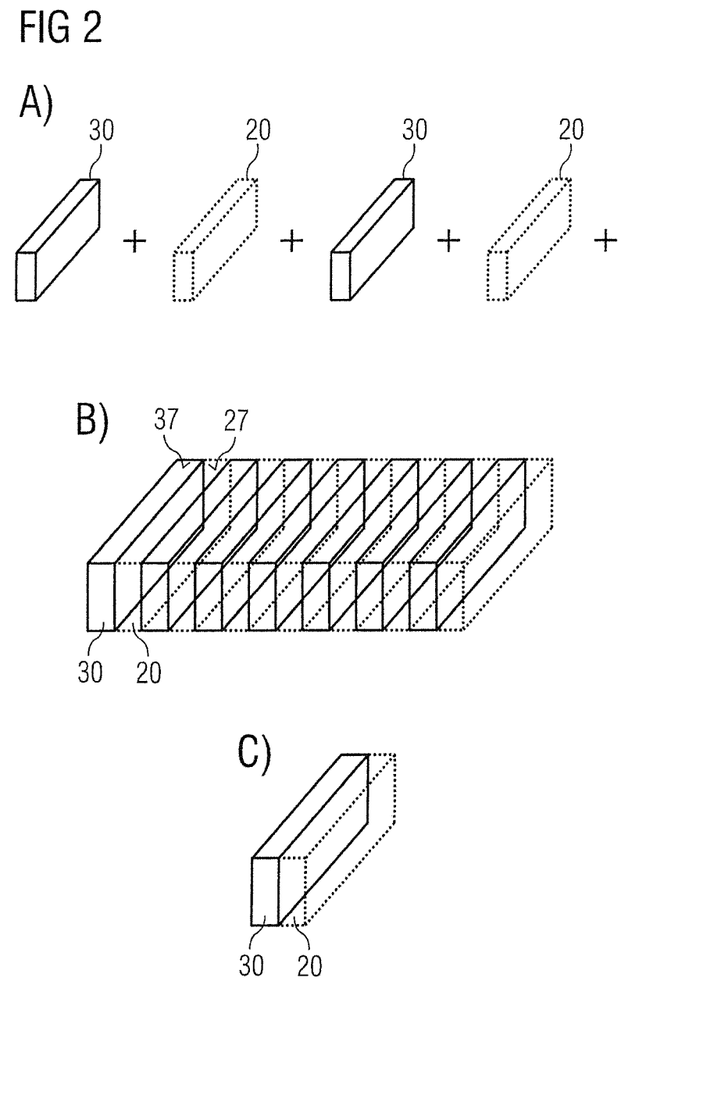

The schematic, perspective illustrations in accordance with FIGS. 2A to 2C illustrate an alternative process of fitting the laser bars 30 to the carrier assemblages 20. In accordance with FIG. 2A, a plurality of laser bars 30 and carrier assemblages 20 are provided and arranged alternately.

In FIG. 2B, the laser bars 30 and the carrier assemblages 20 are combined to form a rack. In this case, the front sides 37 and the end sides 27 preferably terminate flush or approximately flush with one another, in particular with a tolerance of at most 4 µm.

In the rack, the laser bars and the carrier assemblages 20 are heated such that in each case one of the laser bars 30 can be soldered, for instance, onto one of the carrier assemblages 20. The resulting combination of exactly one laser bar 30 and exactly one carrier assemblage 20 mechanically connected thereto is shown in FIG. 2C.

Figure 1:
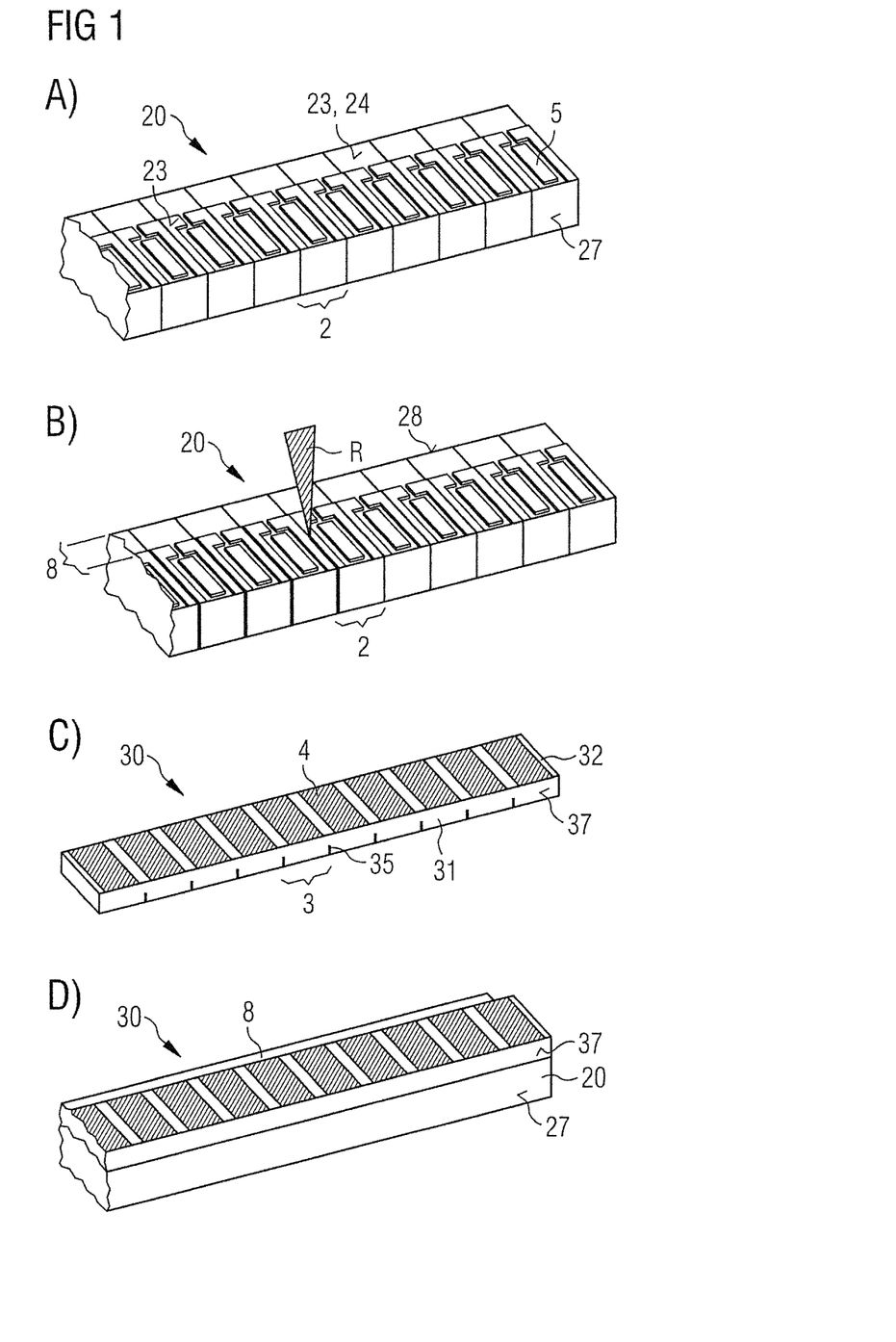
FIGS. 1A-1G, 2A-2C and 4A-4F show schematic perspective illustrations of methods of producing semiconductor laser elements.

The further method steps and the construction of the laser bars 30 and of the carrier assemblages 20 can be implemented in a manner corresponding to the illustration in accordance with FIG. 1.

Figure 3:
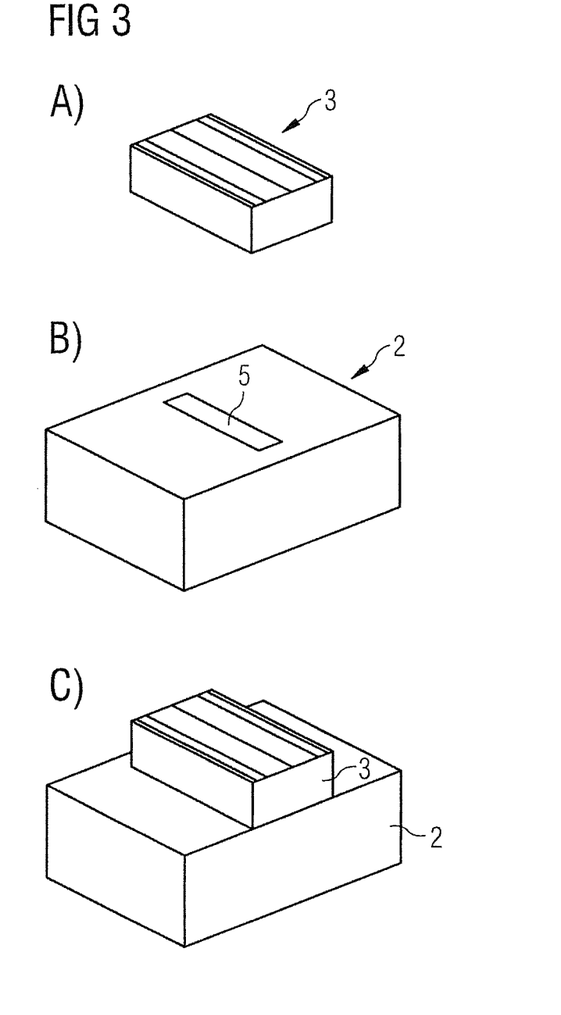
FIGS. 3A-3C show schematic perspective illustrations of a modification of a semiconductor laser element.

A conventional production method is illustrated in association with FIG. 3. A semiconductor laser diode 3 is provided in accordance with FIG. 3A, and an individual, already separated carrier 2 having a contact location 5 in accordance with FIG. 3B. The singulated semiconductor laser diode 3 and the separated carrier 2 are combined as shown in FIG. 3C to form a semiconductor laser element. Since a placement machine operates only comparatively slowly given the required small production tolerances regarding the positioning of the carrier 2 relative to the semiconductor laser diode 3, such a method is associated with a significantly lower throughput and thus higher costs than a method for instance in accordance with FIG. 1 or 2.

Figure 4:
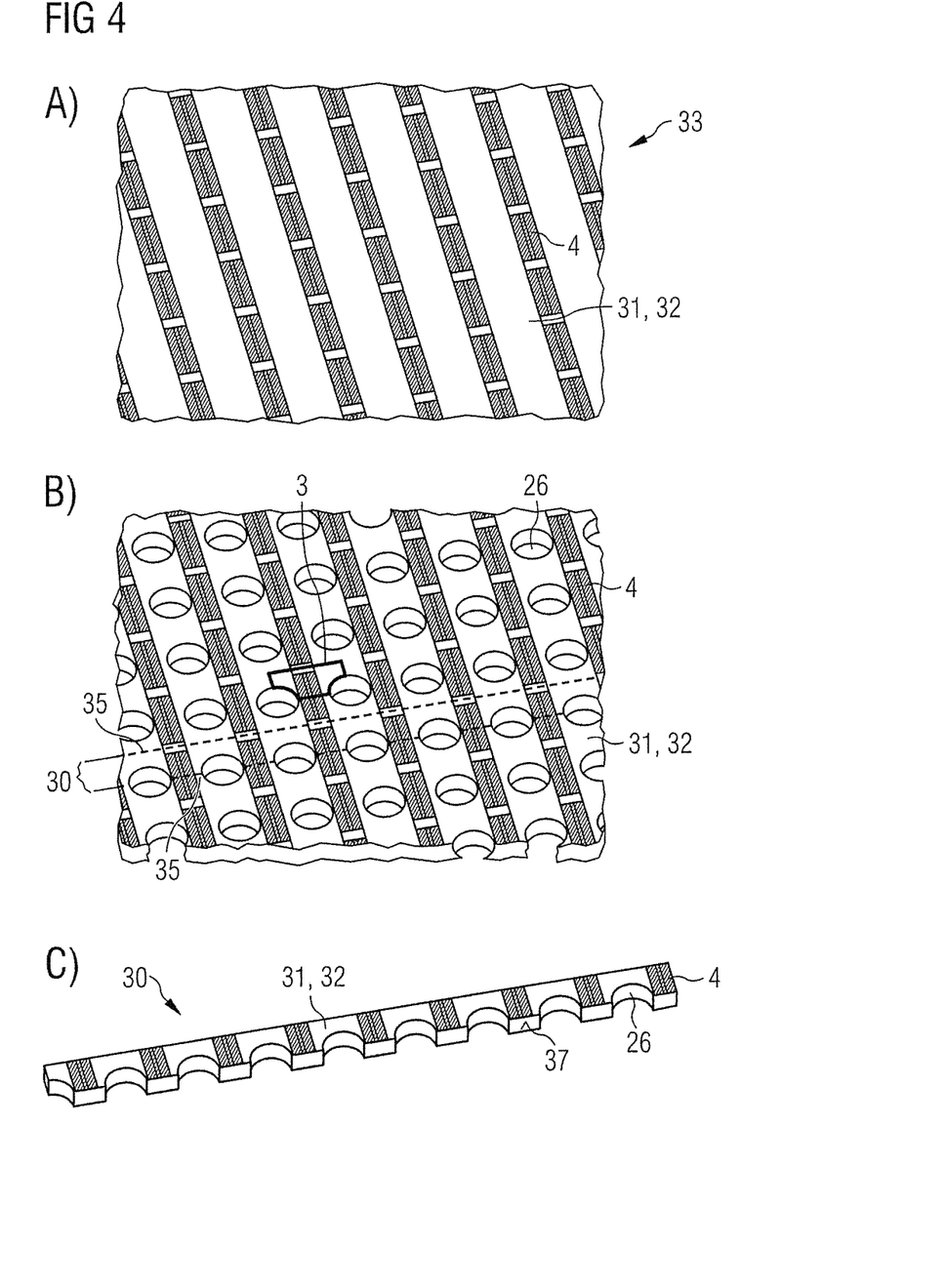

A further example of a method of producing the semiconductor laser element is illustrated in perspective illustrations in association with FIG. 4. A wafer 33 comprising the growth substrate 31 and the semiconductor layer sequence 32 is provided in accordance with FIG. 4A. Strip-shaped metallizations for the contact locations 4 are provided at the top side of the semiconductor layer sequence 32. An optional intermediate carrier is not depicted.

FIG. 4B shows that a multiplicity of holes 26 are produced into the wafer 33, for example, by dry etching or wet etching. The holes 26 are situated in each case between adjacent contact locations 4. In each case, two of the semiconductor laser diodes 3, one of which is framed in bold by way of example in FIG. 4B, share one of the holes 26. The holes 26 penetrate completely through the growth substrate 31 and the semiconductor layer sequence 32.

In a direction perpendicular to the strips that form the contact locations 4, predetermined breaking locations 35 for singulation lines 9 are shaped, for instance by scribing. Along the singulation lines 9, the wafer 33 is divided to form the laser bars 30, preferably by breaking. A resulting laser bar 30 is illustrated in FIG. 4C.

In accordance with FIG. 4D, one of the laser bars 30 is fitted on the carrier assemblage 20.

The singulation to form the semiconductor laser elements 1 with the aid of the singulation lines 9 and the predetermined breaking locations 25, 35 is symbolized in association with FIG. 4E. The resulting semiconductor laser element 1 is depicted schematically in FIG. 4F.

It can be seen in FIG. 4F that the top side 23 with the metallization 24 is not covered by the semiconductor laser diode 3 in places, such that a further contact location 5 is formed. The semiconductor laser diode 3, in particular together with the contact location 4, can be electrically contacted by this contact location 5 composed of the metallization 24 at the top side 23. The further contact location 5 is an n-contact, for example, and a p-contact can be produced by the contact location 4.

Our elements and methods described here are not restricted by the description on the basis of the examples. Rather, this disclosure encompasses any novel feature and also any combination of features, which in particular includes any combination of features in the appended claims, even if the feature or combination itself is not explicitly specified in the claims or examples.

The invention claimed is:

1. A method of producing a plurality of semiconductor laser elements comprising:
    A) providing at least one carrier assemblage having a multiplicity of carriers for the semiconductor laser elements,
    C) providing a wafer comprising a plurality of laser bars having a multiplicity of semiconductor laser diodes which comprise a common growth substrate and a semiconductor layer sequence grown thereon, wherein strip-shaped metallizations for contact locations of the semiconductor laser elements are provided at a top side of the semiconductor layer sequence,
    holes are introduced into the wafer, said holes being situated in each case between adjacent contact locations and penetrating through the common growth substrate and the semiconductor layer sequence completely, and wherein two adjacent semiconductor laser diodes share one of the holes,
    D) fitting the wafer on a top side of the carrier assemblage, wherein the top side of the carrier assemblage is provided with a further metallization, said further metallization not being covered by the semiconductor laser diodes in places and forming further contact locations, wherein the semiconductor laser elements are electrically connectable via the contact locations and the further contact locations, and
    E) singulating to form the semiconductor laser elements after D).

2. The method according to claim 1, wherein the top side is oriented perpendicularly to an end side of the carrier assemblage, and which comprises between A) and C):
    B) producing predetermined breaking locations in the carrier assemblage between adjacent carriers.

3. The method according to claim 2, wherein the end side terminates flush with the semiconductor laser diodes.

4. The method according to claim 1, wherein further predetermined breaking locations are produced at the laser bar before D), and the laser bar is singulated along the further predetermined breaking locations in E).

5. The method according to claim 1, wherein in D) the laser bars are separated to form the semiconductor laser diodes by scribing, breaking and/or laser radiation, and simultaneously or subsequently the carrier assemblage is singulated such that adjacent carriers no longer directly mechanically connect to one another and one or a plurality of the semiconductor laser diodes are situated at each of the carriers.

6. The method according to claim 1, wherein a predetermined breaking location extends 25% to 75% through the carrier assemblage, in a direction perpendicular to the top side.

7. The method according to claim 1, wherein the laser bar in D) comprises 10 to 60 of the semiconductor laser diodes, and the semiconductor laser diodes are monomode lasers.

8. The method according to claim 1, wherein in D) a plurality of the laser bars and a plurality of the carrier assemblages are combined alternately successively to form a rack, and, in each case, one of the laser bars is fixed to exactly one of the carrier assemblages in the rack by soldering.

9. The method according to claim 1, wherein, after E), side surfaces of the divided growth substrate, of the semiconductor layer sequence and of the carriers are aligned parallel to one another and the carriers, and the divided growth substrate and the semiconductor layer sequence have identical widths with a tolerance of at most 6 μm and terminate flush with one another with a tolerance of at most 6 μm.

10. The method according to claim 1, wherein the carrier assemblage projects beyond the laser bar in a direction perpendicular to a rear side situated opposite the end side and a holding strip of the carrier assemblage is formed as a result, and the holding strip is partly or completely removed in or after E).

11. The method according to claim 1, wherein the finished semiconductor laser elements each comprise exactly one of the semiconductor laser diodes, the semiconductor laser elements have a width of 100 µm to 350 µm, a length of 175 µm to 700 µm and a thickness of 125 µm to 450 µm.

12. The method according to claim 1, wherein the carrier assemblage and the carriers are produced from silicon or aluminum nitride and are provided with at least one electrically conductive coating at least in places at the top side.

13. The method according to claim 1, wherein the semiconductor laser diode is based on AlInGaAs and emits laser radiation in the wavelength range of 790 nm to 890 nm.

14. A method of producing a plurality of semiconductor laser elements comprising:
   A) providing at least one carrier assemblage having a multiplicity of carriers for the semiconductor laser elements,
   B) producing predetermined breaking locations in the carrier assemblage between adjacent carriers,
   C) providing at least one laser bar having a multiplicity of semiconductor laser diodes which comprise a common growth substrate and a semiconductor layer sequence grown thereon,
   D) fitting the laser bar on a top side of the carrier assemblage such that the carrier assemblage projects beyond the laser bar in a direction perpendicular to a rear side situated opposite an end side of the carrier assemblage so that a partial region of the carrier assemblage projecting beyond the laser bar forms a holding strip of the carrier assemblage, wherein the holding strip is free of predetermined breaking locations and the individual carriers of the semiconductor laser elements are mechanically connected together by the holding strip, and
   E) singulating at the predetermined breaking locations along singulation lines to form the semiconductor laser elements after D), wherein the holding strip is partly or completely removed during or after E).

15. The method according to claim 14, wherein B) succeeds A).

16. The method according to claim 14, wherein A) and B) are carried out before C).

17. The method according to claim 14, wherein A) and B) are carried out after C).

* * * * *